(12) United States Patent
Lee et al.

(10) Patent No.: US 11,677,366 B2
(45) Date of Patent: Jun. 13, 2023

(54) POWER AMPLIFIER SYSTEM

(71) Applicant: Samsung Electro-Mechanics Co., Ltd., Suwon-si (KR)

(72) Inventors: Geunyong Lee, Suwon-si (KR); Suyeon Han, Suwon-si (KR); Seungchul Pyo, Suwon-si (KR); Jaehyouck Choi, Suwon-si (KR); Youngsik Hur, Suwon-si (KR); Yoosam Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 391 days.

(21) Appl. No.: 17/109,587

(22) Filed: Dec. 2, 2020

(65) Prior Publication Data

US 2022/0085775 A1 Mar. 17, 2022

(30) Foreign Application Priority Data

Sep. 15, 2020 (KR) .................. 10-2020-0118351

(51) Int. Cl.
*H03F 3/24* (2006.01)
*H03F 3/195* (2006.01)
*H03F 1/56* (2006.01)

(52) U.S. Cl.
CPC .............. *H03F 3/245* (2013.01); *H03F 1/56* (2013.01); *H03F 3/195* (2013.01); *H03F 2200/318* (2013.01); *H03F 2200/451* (2013.01)

(58) Field of Classification Search
CPC ....................................................... H03F 3/245
See application file for complete search history.

(56) References Cited

U.S. PATENT DOCUMENTS

| | | | | |
|---|---|---|---|---|
| 4,847,522 A | * | 7/1989 | Fuller | H03K 17/102 326/85 |
| 5,973,568 A | * | 10/1999 | Shapiro | H03F 3/602 330/295 |
| 8,022,762 B2 | | 9/2011 | Kim et al. | |
| 10,555,720 B2 | * | 2/2020 | Corl | B06B 1/0633 |
| 2003/0218185 A1 | * | 11/2003 | Ohbu | H01L 29/0692 257/E29.189 |
| 2007/0232050 A1 | * | 10/2007 | Toyama | H05K 1/183 257/E23.178 |
| 2015/0188501 A1 | | 7/2015 | Choi et al. | |
| 2017/0141744 A1 | | 5/2017 | Kim et al. | |
| 2021/0098585 A1 | * | 4/2021 | Umemoto | H01L 27/0658 |
| 2021/0313284 A1 | * | 10/2021 | Noori | H01L 23/49548 |
| 2021/0313285 A1 | * | 10/2021 | Noori | H01L 23/5384 |

FOREIGN PATENT DOCUMENTS

| | | |
|---|---|---|
| KR | 10-1153568 B1 | 6/2012 |
| KR | 10-2015-0078386 A | 7/2015 |
| KR | 10-2017-0056391 A | 5/2017 |

* cited by examiner

*Primary Examiner* — Patricia T Nguyen
(74) *Attorney, Agent, or Firm* — NSIP Law

(57) ABSTRACT

A power amplifier system includes: a base substrate; a driver stage configured to receive and amplify an RF input signal, wherein the driver stage is disposed within the base substrate and is implemented in a first substrate; and a power stage configured to receive the RF input signal amplified by the driver stage and amplify the RF input signal amplified by the driver stage, wherein the power stage is disposed outside the base substrate and is implemented in a second substrate independent from the first substrate.

28 Claims, 9 Drawing Sheets

POWER AMPLIFIER SYSTEM

CROSS-REFERENCE TO RELATED APPLICATIONS

This application claims the benefit under 35 U.S.C. § 119(a) of Korean Patent Application No. 10-2020-0118351, filed on Sep. 15, 2020 in the Korean Intellectual Property Office, the entire disclosure of which is incorporated herein by reference for all purposes.

BACKGROUND

Field

The following description relates to a power amplifier system.

Description of Related Art

A wireless communication system adopts various digital modulation and demodulation methods depending on evolution of communication standards. An existing code division multiple access (CDMA) communication system employs a quadrature phase shift keying (QPSK) method, and a wireless LAN depending on an IEEE communication standard employs an orthogonal frequency division multiplexing (OFDM) method. In addition, recent 3GPP standard standards such as long-term evolution (LTE), LTE-advanced, and 5G employ the QPSK method, a quadrature amplitude modulation (QAM) method, and the OFDM method. These wireless communication standards employ a linear modulation method requiring that a size or phase of a transmission signal be maintained during transmission.

A transmission device used in a wireless communication system includes a power amplifier that amplifies a radio frequency (RF) signal in order to increase a transmission distance. This power amplifier, which is a circuit disposed at an end portion of a transmitting device, is an important circuit element that affects output power, linearity, and power efficiency of a wireless communication system.

3GPP newly defined the 5G NR (New Radio) standard developed from the existing LTE standard. It is required that the power amplifier has high linear power and high efficiency in order to meet the 5G NR specification, and it is also required that the power amplifier have high reliability. In addition, since an area and price occupied by the power amplifier in the wireless communication system is large, it is desirable to reduce the area and cost of the power amplifier as the wireless communication system is miniaturized.

The above information disclosed in this Background section is only for enhancement of understanding of the background of the disclosure, and therefore it may contain information that does not form the prior art that is already known.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a power amplifier system includes: a base substrate; a driver stage configured to receive and amplify an RF input signal, wherein the driver stage is disposed within the base substrate and is implemented in a first substrate; and a power stage configured to receive the RF input signal amplified by the driver stage and amplify the RF input signal amplified by the driver stage, wherein the power stage is disposed outside the base substrate and is implemented in a second substrate independent from the first substrate.

The power amplifier system may further include an inter-stage matcher disposed in the base substrate, and configured to match impedance of a signal transfer path between the driver stage and the power stage.

The inter-stage matcher may include a plurality of inter-stage matching patterns positioned in one or more layers.

The inter-stage matcher may include a transformer, or a circuit including an inductor and a capacitor connected to each other.

The power amplifier system may further include an inter-stage matcher implemented in the driver stage, and configured to match impedance of a signal transfer path between the driver stage and the power stage.

The power amplifier system may further include an inter-stage matcher implemented in the power stage, and configured to match impedance of a signal transfer path between the driver stage and the power stage.

The power amplifier system may further include an output matcher mounted in the base substrate, and configured to match impedance of a signal transfer path between the power stage and a terminal of an RF output signal output from the output matcher.

The output matcher may include a plurality of output matching patterns positioned in one or more layers.

The output matcher may include a transformer, or a circuit including an inductor and a capacitor connected to each other.

The power amplifier system may further include an output matcher implemented in the power stage, and configured to match impedance of a signal transfer path between the power stage and a terminal of an RF output signal output from the output matcher.

The drive stage may include: a first drive amplifier configured to receive and amplify a non-inverted RF input signal of the RF input signal; and a second drive amplifier configured to receive and amplify an inverted RF input signal of the RF input signal.

The power stage may include: a first power amplifier configured to amplify the non-inverted RF input signal amplified by the first drive amplifier; and a second power amplifier configured to amplify the inverted RF input signal amplified by the first drive amplifier.

In another general aspect a power amplifier system includes: a drive stage configured to receive and amplify an RF input signal, and implemented in a first substrate; a power stage configured to receive an RF signal from the driver stage and amplify the RF signal, wherein the power stage is connected to the drive stage and is implemented in a second substrate independent from the first substrate; and an inter-stage matcher configured to match impedance of a signal transfer path between the driver stage and the power stage, wherein the inter-stage matcher is implemented in a third substrate independent from the drive stage and the power stage or the inter-stage matcher is implemented in the second substrate together with the power stage.

The power amplifier system may further include an output matcher configured to match impedance of a signal transfer path between the power stage and a terminal of an RF output signal output from the output matcher.

The power amplifier system may further include an input matcher configured to match impedance of a signal transfer path between the drive stage and a terminal of the RF input signal.

The RF input signal may include an inverted RF input signal and a non-inverted RF input signal, and the drive stage may be further configured to amplify a difference between the inverted RF input signal and the non-inverted RF input signal.

The first substrate may be formed of a first material. The second substrate may be formed of a second material having an electron mobility higher than an electron mobility of the first material.

The first substrate may be formed of silicon. The second substrate may be formed of gallium arsenide.

The inter-stage matcher may be implemented in the third substrate. The first substrate may be embedded in the third substrate.

The second substrate may be mounted on a surface of the third substrate. The inter-stage matcher may be disposed in the third substrate between the first substrate and the surface.

In another general aspect, a power amplifier system includes: a base substrate; a first integrated circuit (IC) disposed in the base substrate and including one or more driver amplifiers implemented in a first substrate, wherein the one or more driver amplifiers are configured to receive and amplify an RF input signal; and a second IC mounted on an outer surface of the base substrate and including one or more power amplifiers implemented in a second substrate having an electron mobility higher than an electron mobility of the first substrate, wherein the one or more power amplifiers are configured to receive the RF input signal amplified by the one or more driver amplifiers and amplify the RF input signal amplified by the one or more driver amplifiers.

The first substrate may contain silicon and the second substrate may contain gallium arsenide.

The power amplifier system may further include an inter-stage matcher disposed in the first IC or the base substrate, and configured to match impedance of a signal transfer path between the one or more driver amplifiers and the one or more power amplifiers.

The power amplifier system may further include an output matcher mounted in the second IC or the base substrate, and configured to match impedance of a signal transfer path between the one or more power amplifiers and a terminal of an RF output signal output from the output matcher.

In another general aspect, a power amplifier system includes: a base substrate; a driver stage configured to receive and amplify an RF input signal, wherein the driver stage is externally mounted on the base substrate or embedded in the base substrate, and is implemented in a first substrate; and a power stage configured to receive the RF input signal amplified by the driver stage and amplify the RF input signal amplified by the driver stage, wherein the power stage is externally mounted on the base substrate and is implemented in a second substrate independent from the first substrate.

The first substrate may be formed of a first material. The second substrate may be formed of a second material having an electron mobility higher than an electron mobility of the first material.

The power amplifier system may further include an inter-stage matcher implemented in any one of the driver stage, the power stage, and the base substrate, and configured to match impedance of a signal transfer path between the driver stage and the power stage.

The power amplifier system may further include an output matcher implemented in the power stage or the base substrate, and configured to match impedance of a signal transfer path between the power stage and a terminal of an RF output signal output from the output matcher.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
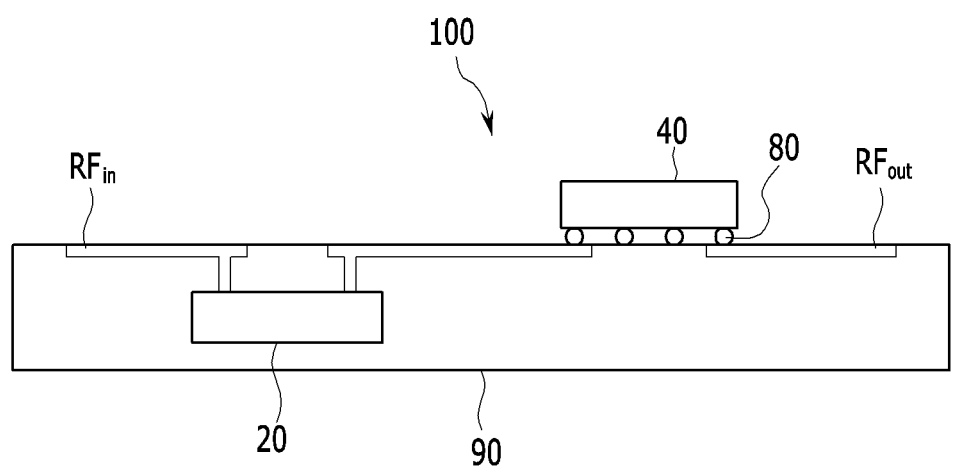
FIG. 1 illustrates a cross-section of a power amplifier system, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Throughout this disclosure, RF signals may include Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter, but the disclosure is not limited thereto.

Throughout the specification, a first portion being "mounted" in a second portion includes not only a case in which the first portion is mounted outside of the second portion, but also a case in which the first portion is mounted inside of or integrated in the second portion.

FIG. 1 illustrates a cross-section of a power amplifier system 100, according to an embodiment.

Referring to FIG. 1, the power amplifier system 100 may generate an RF output signal by amplifying an RF input signal at a predetermined ratio. The power amplifier system 100 may include, for example, a drive stage 20 and a power stage 40.

The drive stage 20 receives power and amplifies the RF input signal $RF_{in}$. The drive stage 20 includes one or more drive amplifiers. When the drive amplifier amplifies the RF input signal $RF_{in}$ based on a predetermined gain, a gain of the drive amplifier may be determined based on a breakdown voltage of the drive amplifier.

The drive stage 20 may be implemented as an integrated circuit (IC) by a semiconductor manufacturing process using a substrate containing silicon. For example, the drive stage 20 may be an IC implemented in a silicon wafer. The semiconductor manufacturing process using the substrate containing silicon has a relatively lower cost than a semiconductor manufacturing process using a substrate containing gallium arsenide. Accordingly, when the drive stage 20 is implemented in a silicon substrate, a cost of the power amplifier system 100 may be lowered. Furthermore, since the power amplifier system 100 occupies a largest proportion of a unit cost of a communication module, the unit cost of the communication module may be greatly reduced. However, the drive stage 20 may be implemented as a single IC by a semiconductor manufacturing process using a substrate containing gallium arsenic.

In addition, the drive stage 20 is embedded inside a base substrate 90. The drive stage 20 may receive the RF input signal $RF_{in}$ through a via that vertically passes through at least a portion of the base substrate 90.

If the drive stage 20 were to be installed outside the base substrate 90, a ground of the drive stage 20 would be connected from an upper end of the base substrate to a ground portion at a lower end of the base substrate 90 through vias, and thus power loss may occur due to heat. However, since the drive stage 20 is embedded inside the base substrate 90, the ground of the drive stage 20 is connected through a through via only from a layer where the drive stage 20 is disposed to the ground portion at the lower portion of the base substrate 90, and, thus, the power loss due to heat may be relatively reduced compared with a case in which the drive stage 20 is installed outside the base substrate 90. In addition, when the drive stage 20 is embedded inside the base substrate 90 and an inter-stage matching unit (or inter stage matcher) is not included inside the drive stage 20 but is embedded in the base substrate 90 independently from the drive stage 20, the power loss may be reduced by about 50% or more compared with a case in which the inter-stage matching unit and the drive stage 20 are implemented as a single IC and embedded within the base substrate 90, and the gain of the drive stage 20 may be increased.

In addition, either one or both of an input matching unit (or input matcher) and the inter-stage matching unit may be selectively implemented inside the drive stage 20, and, in this case, either one or both of the input matching unit and the inter-stage matching unit are implemented as a single IC together with the drive stage 20. Herein, the input matching unit matches impedance of a signal transfer path between a terminal of the RF input signal and the drive terminal 20, and the inter-stage matching unit matches impedance of a signal transfer path between the drive stage 20 and the power stage 40.

The power stage 40 receives power and amplifies the RF signal from the drive stage 20 to output an RF output signal $RF_{out}$. The power stage 40 includes one or more power amplifiers. The power stage 40 may be installed outside the base substrate 90, and the power stage 40 may be connected to the base substrate 90 through an electrical connection structure 80. For example, the electrical connection structure 80 may have a structure such as a solder ball, a pin, a land, or a pad. The power stage 40 and the drive stage 20 may be connected to each other through a via vertically passing through at least a portion of the base substrate 90.

The power stage 40 may be implemented as a single IC by a semiconductor manufacturing process using a substrate containing gallium arsenic. For example, the power stage 40 may be an IC implemented in a gallium arsenic wafer. When the substrate containing gallium arsenic is used, since electron mobility of gallium arsenic is higher than that of silicon, and required wire capacity is small, an electrical characteristic is excellent. Accordingly, when the power stage 40 is implemented in the substrate containing gallium arsenic, linearity is high, and high power output is easily obtained due to a high breakdown voltage. An IC formed on a substrate containing gallium arsenide can achieve higher power and higher linearity than an IC formed on the substrate containing silicon, and thus the RF signal amplified through the power amplifier of the power stage 40 may have high power and linearity, and may have high reliability. However, the power stage 40 may be implemented as a single IC by a semiconductor manufacturing process using a substrate containing silicon.

Either one or both of the input matching unit and the inter-stage matching unit may be selectively implemented inside the power stage 40, and, in this case, either one or both of the inter-stage matching unit and an output matching unit (or output matcher) are implemented as a single IC together with the power stage 40. Herein, the inter-stage matching unit matches impedance of the signal transfer path between the drive stage 20 and the power stage 40, and the output matching unit matches impedance of a signal transfer path between the power stage 40 and a terminal of an RF output signal terminal.

Referring to FIG. 1, heat generation of the power amplifier system 100 may be minimized by installing the power stage 40, which generates a lot of heat, outside the base substrate 90. Furthermore, heat loss due to grounding may be minimized by embedding the drive stage 20, which generates relatively little heat, inside the base substrate 90, thereby minimizing power loss of the power amplifier system 100. In addition, a size of a communication module may be reduced by maximizing space utilization of the communication module by vertically arranging the power stage 40 and the drive stage 20.

Alternatively, the power stage 40, which requires relatively high linear power, may be implemented in a substrate containing gallium arsenide, to implement the drive stage 20, which requires relatively low power, on a substrate containing silicon having a low unit cost while efficiency of the power amplifier system 100 is increased, thereby reducing a cost of the power amplifier system 100. Accordingly, the power loss of the power amplifier system 100 may be minimized. Thus, the power amplifier system 100 may have high linear power and high power efficiency, and, simultaneously, the manufacturing cost of the power amplifier system 100 may be minimized.

Figure 2:
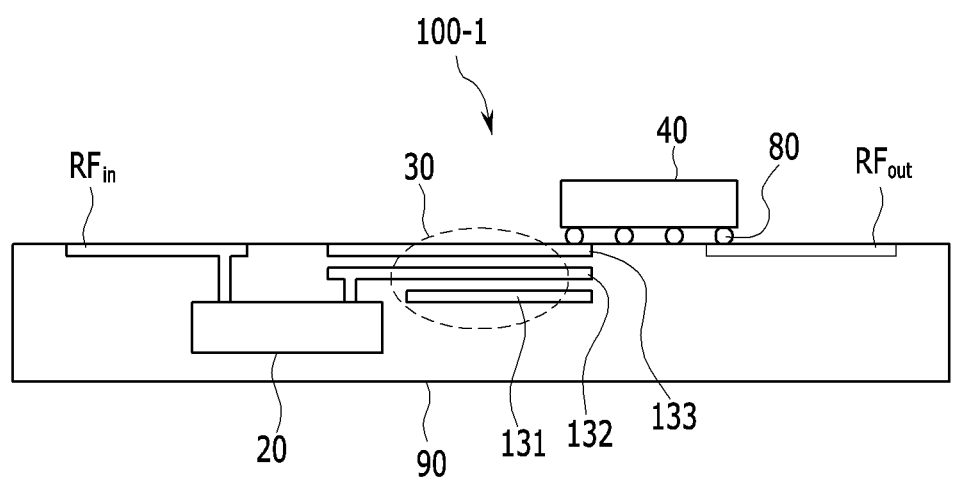
FIG. 2 illustrates a cross-section of a power amplifier system, according to an embodiment.

FIG. 2 illustrates a cross-section of a power amplifier system 100-1, according to an embodiment.

Referring to FIG. 2, the power amplifier system 100-1 may generate an RF output signal by amplifying an RF input signal at a predetermined ratio. The power amplifier system 100-1 includes the drive stage 20, an inter-stage matching unit (or inter-stage matcher) 30, and the power stage 40.

The drive stage 20 receives power and amplifies the RF input signal $RF_{in}$. The drive stage 20 includes one or more drive amplifiers. When the drive amplifier amplifies the RF input signal on a predetermined gain, a gain of the drive amplifier may be determined based on a breakdown voltage of the drive amplifier.

The drive stage 20 may be implemented as a single IC by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20 is implemented in a silicon substrate, a cost of the power amplifier system 100-1 may be lowered. Furthermore, since the power amplifier system 100-1 occupies a largest proportion of a unit cost of a communication module, the unit cost of the communication module may be greatly reduced. However, the drive stage 20 may be implemented as a single IC by a semiconductor manufacturing process using a substrate containing gallium arsenic.

In addition, the drive stage 20 is embedded inside the base substrate 90. The drive stage 20 receives the RF input signal $RF_{in}$ through a via that vertically passes through at least a portion of the base substrate 90.

If the drive stage 20 were to be installed outside the base substrate, a ground of the drive stage 20 would be connected from an upper end of the base substrate to a ground portion at a lower end of the base substrate through vias, and thus power loss may occur due to heat. However, since the drive stage 20 is embedded inside the base substrate 90, the ground of the drive stage 20 is connected through a through via only from a layer where the drive stage 20 is disposed to the ground portion at the lower portion of the base substrate, and, thus, the power loss due to heat may be relatively reduced compared with a case in which the drive stage is installed outside the base substrate 90. In addition, when the drive stage 20 is embedded inside the base substrate 90 and the inter-stage matching unit 30 is not included inside the drive stage 20 but is embedded in the base substrate 90 independently from the drive stage 20, the power loss may be reduced by about 50% or more compared with a case in which the inter-stage matching unit 30 and the drive stage 20 are implemented as a single IC and embedded within the base substrate 90, and the gain of the drive stage 20 may be increased.

In addition, the input matching unit may be selectively implemented inside the drive stage 20, and, in this case, the input matching unit and the drive stage 20 are implemented together as a single IC. Herein, the input matching unit matches impedance of the signal transfer path between a terminal of the RF input signal and the drive terminal 20.

The inter-stage matching unit 30 may match impedance of the signal transfer path between the drive terminal 20 and the power stage 40. The inter-stage matching unit 30 may be a transformer, for example. In addition, the inter-stage matching circuit 30 may be a circuit in which an inductor and a capacitor are connected to each other, and may be, for example, an L-type circuit, a T-type circuit, a π-type circuit, or the like.

The inter-stage matching unit 30 includes a plurality of inter-stage matching patterns positioned in one or more layers. For example, the inter-stage matching unit 30 may include a plurality of inter-stage matching patterns 131, 132, and 133 positioned on three layers, respectively. The second inter-stage matching pattern 132 may be separately positioned above the first inter-stage matching pattern 131 at a predetermined distance, and may overlap at least a portion of the first inter-stage matching pattern 131. The second inter-stage matching pattern 132 and the drive stage 20 may be connected to each other through a via vertically passing through at least a portion of the base substrate 90, and, accordingly, the second inter-stage matching pattern 132 receives the RF signal amplified by the drive stage 20. The third inter-stage matching pattern 133 may be separately positioned above the second inter-stage matching pattern 132 at a certain distance, may overlap at least a portion of the first inter-stage matching pattern 131, and may overlap at least a portion of the second inter-stage matching pattern 132. The RF signal output from the drive stage 20 is sequentially input into the power stage 40 through the inter-stage matching unit 30 and the electrical connection structure 80.

The power stage 40 receives power and amplifies the RF signal from the drive stage 20 to output an RF output signal $RF_{out}$. The power stage 40 includes one or more power amplifiers. The power stage 40 is installed outside the base substrate 90, and the power stage 40 is connected to the base substrate 90 through an electrical connection structure 80. For example, the electrical connection structure 80 may have a structure such as a solder ball, a pin, a land, or a pad.

The power stage 40 may be implemented as a single IC by a semiconductor manufacturing process using a substrate containing gallium arsenic. When the substrate containing gallium arsenic is used, since electron mobility of gallium arsenic is higher than that of silicon, and required wire capacity is small, an electrical characteristic is excellent. Accordingly, when the power stage 40 is implemented in the substrate containing gallium arsenic, linearity is high, and high power output is easily obtained due to a high breakdown voltage. An IC formed on a substrate containing gallium arsenide can achieve higher power and higher linearity than an IC formed on the substrate containing silicon, and thus the RF signal amplified through the power amplifier of the power stage 40 may have high power and linearity, and may have high reliability. However, the power stage 40 may be implemented as a single IC by a semiconductor manufacturing process using a substrate containing silicon.

In addition, the output matching unit may be selectively implemented inside the power stage 40, and in this case, the output matching unit and the power stage 40 are implemented together as a single IC. Herein, the output matching unit matches impedance of the signal transfer path between the power stage 40 and the terminal of the RF output signal.

Referring to FIG. 2, heat generation of the power amplifier system 100-1 may be minimized by installing the power stage 40, which generates a lot of heat, outside the base substrate 90. Additionally, heat loss due to grounding may be minimized by embedding the drive stage 20, which generates relatively little heat, inside the base substrate 90, thereby minimizing power loss of the power amplifier system 100-1. In addition, a size of the communication module may be reduced by maximizing space utilization of the communication module by vertically arranging the power stage 40 and the drive stage 20. At the same time, it is possible to facilitate power loss minimization and circuit optimization while reducing a manufacturing cost by directly mounting the inter-stage matching unit 30 in the communication module independently from the drive stage 20 and the power stage 40.

Alternatively, the power stage 40, which requires relatively high linear power, may be implemented in a substrate containing gallium arsenide to implement the drive stage 20, which requires relatively low power, on a substrate containing silicon having a low unit cost while efficiency of the power amplifier system 100-1 is increased, thereby reducing a cost of the power amplifier system 100-1. Accordingly, the power loss of the power amplifier system 100-1 is minimized, and thus the power amplifier system 100 may have high linear power and high power efficiency, and simultaneously, the manufacturing cost of the power amplifier system 100-1 may be minimized.

Figure 3:
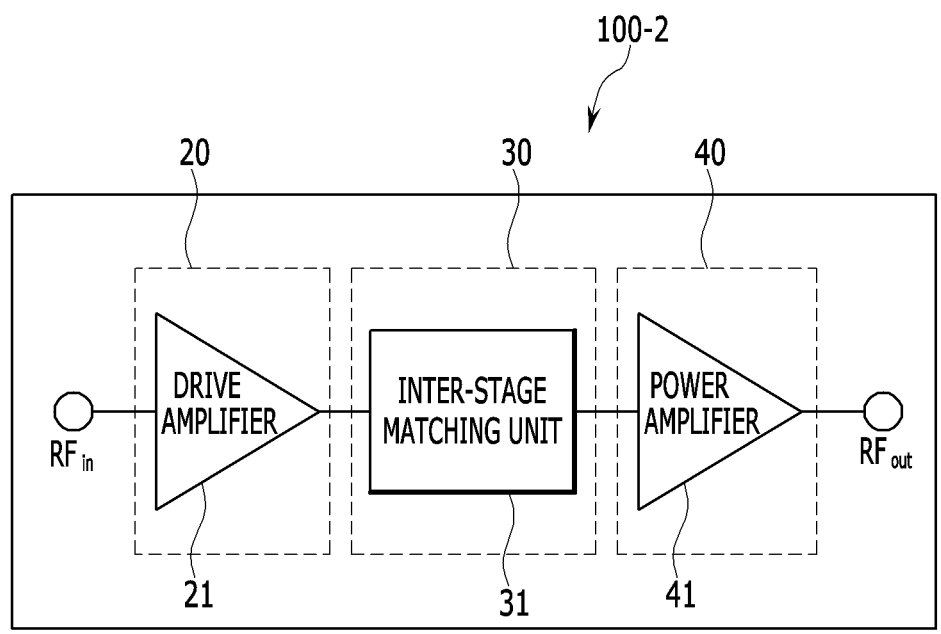
FIG. 3 illustrates a power amplifier system, according to an embodiment.

FIG. 3 illustrates a cross-section of a power amplifier system 100-2, according to an embodiment.

Referring to FIG. 3, the power amplifier system 100-2 may generate an RF output signal by amplifying an RF input signal at a predetermined ratio. The power amplifier system 100-2 includes the drive stage 20, the inter-stage matching unit 30, and the power stage 40.

The drive stage 20 receives power and amplifies the RF input signal $RF_{in}$. The drive stage 20 includes one or more drive amplifiers 21. When the drive amplifier 21 amplifies the RF input signal $RF_{in}$ based on a predetermined gain, a gain of the drive amplifier 21 may be determined based on a breakdown voltage of the drive amplifier 21.

The drive stage 20 may be implemented as a single IC by a semiconductor manufacturing process using a substrate containing silicon. The semiconductor manufacturing process using the substrate containing silicon has a relatively lower cost than a semiconductor manufacturing process of using a substrate containing gallium arsenide. Accordingly, when the drive stage 20 is implemented in a silicon substrate, a cost of the power amplifier system 100-2 may be lowered. Furthermore, since the power amplifier system 100-2 occupies a largest proportion of a unit cost of a communication module, the unit cost of the communication module may be greatly reduced. However, the drive stage 20 may be implemented as a single IC by a semiconductor manufacturing process using a substrate containing gallium arsenic.

The drive stage 20 may be installed outside the base substrate, and, in this case, the drive stage 20 may be connected to the base substrate through an electrical connection structure. In addition, the drive stage 20 is embedded inside the base substrate. In this case, since there is no power loss caused by the electrical connection structure, the power loss of the drive stage 20 may be greatly reduced, and a gain of the drive stage 20 may be increased.

The inter-stage matching unit 30 may match impedance of the signal transfer path between the drive terminal 20 and the power stage 40. The inter-stage matching unit 30 includes one or more inter-stage matching circuits 31. For example, the inter-stage matching circuit 31 may be a circuit in which an inductor and a capacitor are connected to each other, and may include a transformer. The inter-stage matching circuit 31 is connected to between an output terminal of the drive amplifier 21 and an input terminal of a power amplifier 41.

The power stage 40 receives power and amplifies the RF signal from the drive stage 20 to output an RF output signal $RF_{out}$. The power stage 40 includes one or more power amplifiers 41. The power stage 40 may be installed outside the base substrate, and in this case, the power stage 40 may be connected to the base substrate through an electrical connection structure. For example, the electrical connection structure may have a structure such as a solder ball, a pin, a land, or a pad.

The power stage 40 may be implemented as a single IC by a semiconductor manufacturing process using a substrate containing gallium arsenic. When the substrate containing gallium arsenic is used, since electron mobility of gallium arsenic is higher than that of silicon, and required wire capacity is small, an electrical characteristic is excellent. Accordingly, when the power stage 40 is implemented in the substrate containing gallium arsenic, linearity is high, and high power output is easily obtained due to a high breakdown voltage. An IC formed on a substrate containing gallium arsenide can achieve higher power and higher linearity than an IC formed on the substrate containing silicon, and thus the RF signal amplified through the power amplifier 41 of the power stage 40 may have high power and linearity, and may have high reliability. However, the power stage 40 may be implemented as a single IC by a semiconductor manufacturing process using a substrate containing silicon.

The inter-stage matching unit 30 may also not be included anywhere inside the IC in which the drive stage 20 is implemented or the IC in which the power stage 40 is implemented, and may be directly mounted in a communication module independently from these ICs. In this case, since the inter-stage matching unit 30 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated. In addition, the inter-stage matching unit 30 may be manufactured as a single IC together with the power stage 40 by a semiconductor manufacturing process.

Referring to FIG. 3, it is possible to facilitate power loss minimization and circuit optimization while reducing a manufacturing cost by directly mounting the inter-stage matching unit 30 in the communication module independently from the drive stage 20 and the power stage 40. Alternatively, the power stage 40, which requires relatively high linear power, may be implemented in a substrate containing gallium arsenide to implement the drive stage 20, which requires relatively low power, on a substrate containing silicon having a low unit cost while efficiency of the power amplifier system 100-2 is increased, thereby reducing a cost of the power amplifier system 100-2.

Figure 4:
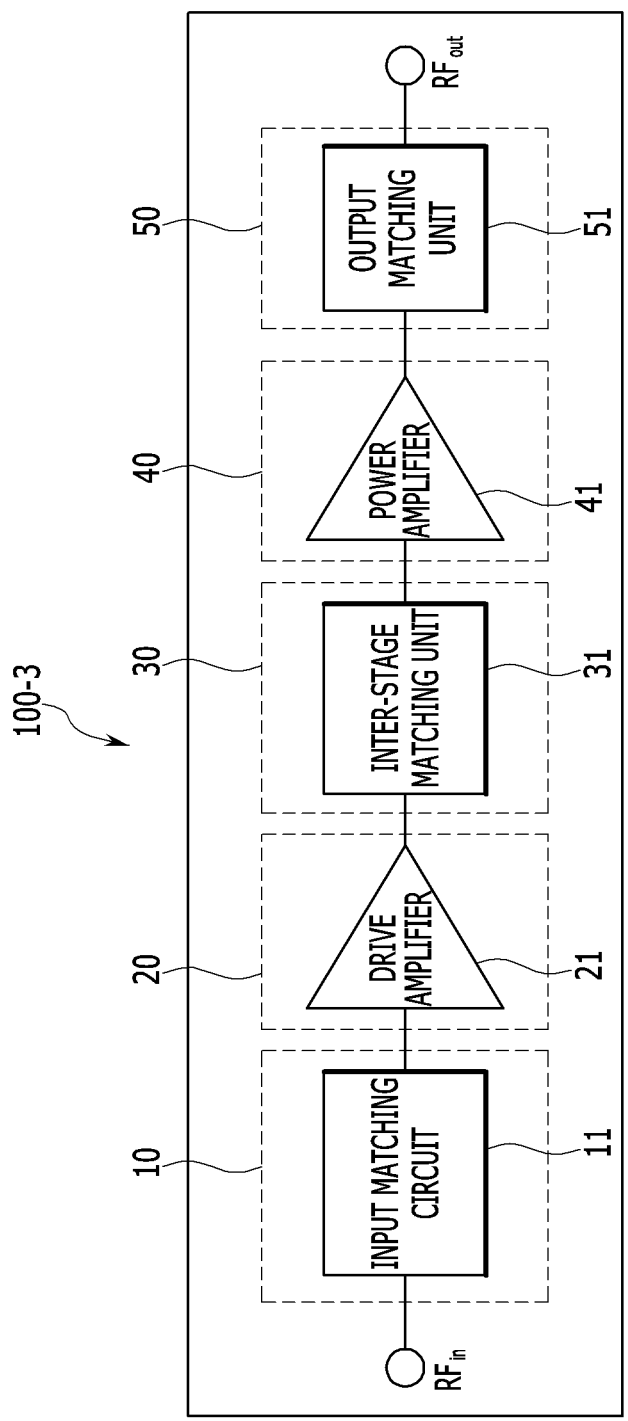
FIG. 4 illustrates a power amplifier system, according to an embodiment.

FIG. 4 illustrates a power amplifier system 100-3, according to an embodiment.

Referring to FIG. 4, the power amplifier system 100-3 may receive an RF input signal $RF_{in}$ and amplifies the RF input signal $RF_{in}$ at a predetermined ratio to generate an RF output signal $RF_{out}$. The power amplifier system 100-3 includes an input matching unit 10 (or input matcher), the drive stage 20, the inter-stage matching unit 30, the power stage 40, and an output matching unit (or output matcher) 50.

The input matching unit 10 may match impedance of the signal transfer path between the drive stage 20 and a terminal receiving the RF input signal $RF_{in}$. The input matching unit 10 includes one or more input matching circuits 11. For example, the input matching circuit 11 may be a circuit in which an inductor and a capacitor are connected. The input matching circuit 11 is connected between a terminal for receiving the RF input signal $RF_{in}$ and the input terminal of the drive amplifier 20.

The drive stage 20 receives power and amplifies the RF input signal $RF_{in}$. The drive stage 20 includes the one or more drive amplifiers 21. When the drive amplifier 21 amplifies the RF input signal $RF_{in}$ based on a predetermined gain, a gain of the drive amplifier 21 may be determined based on a breakdown voltage of the drive amplifier 21.

The drive stage 20 may be implemented as a single IC by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20 is implemented in a silicon substrate, a cost of the power amplifier system 100-3 may be lowered. Furthermore, since the power amplifier system 100-3 occupies a largest proportion of a unit cost of a communication module, the unit cost of the communication module may be greatly reduced. However, the drive stage 20 may be implemented as a single IC by a semiconductor manufacturing process using a substrate containing gallium arsenic.

The input matching unit 10 and the drive stage 20 may be manufactured together as one IC by the semiconductor manufacturing process. In addition, in contrast to the drive stage 20, the input matching unit 10 may not be implemented inside the IC, and may be directly mounted in the communication module independently from the IC. In this case, since the input matching unit 10 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

The drive stage 20 may be installed outside the base substrate, and in this case, the drive stage 20 may be connected to the base substrate through an electrical connection structure. In addition, the drive stage 20 may be embedded inside the base substrate. In this case, since there is no power loss caused by the electrical connection structure, the power loss of the drive stage 20 may be greatly reduced, and a gain of the drive stage 20 may be increased.

The inter-stage matching unit 30 may match impedance of the signal transfer path between the drive terminal 20 and the power stage 40. The inter-stage matching unit 30 includes the one or more inter-stage matching circuits 31. For example, the inter-stage matching circuit 31 may be a circuit in which an inductor and a capacitor are connected to each other, and may include a transformer. The inter-stage matching circuit 31 is connected between an output terminal of the drive amplifier 21 and an input terminal of the power amplifier 41.

The power stage 40 receives power and amplifies the RF signal from the drive stage 20 to output an RF output signal $RF_{out}$. The power stage 40 includes the one or more power amplifiers 41. The power stage 40 may be installed outside the base substrate, and in this case, the power stage 40 may be connected to the base substrate through an electrical connection structure. For example, the electrical connection structure may have a structure such as a solder ball, a pin, a land, or a pad.

The power stage 40 may be implemented as a single IC by a semiconductor manufacturing process using a substrate containing gallium arsenic. When the substrate containing gallium arsenic is used, since electron mobility of gallium arsenic is higher than that of silicon, and required wire capacity is small, an electrical characteristic is excellent. Accordingly, when the power stage 40 is implemented in the substrate containing gallium arsenic, linearity is high, and high power output is easily obtained due to a high breakdown voltage. An IC formed on a substrate containing gallium arsenide can achieve higher power and higher linearity than an IC formed on the substrate containing silicon, and thus the RF signal amplified through the power amplifier 41 of the power stage 40 may have high power and linearity, and may have high reliability. However, the power stage 40 may be implemented as a single IC by a semiconductor manufacturing process using a substrate containing silicon.

The inter-stage matching unit 30 may also not be included anywhere inside the IC in which the drive stage 20 is implemented or the IC in which the power stage 40 is implemented, and may be directly mounted in the communication module independently from these ICs. In this case, since the inter-stage matching unit 30 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated. In addition, the inter-stage matching unit 30 may be manufactured as a single IC together with the power stage 40 by a semiconductor manufacturing process.

The output matching unit 50 may match impedance for the signal transfer path between the power stage 40 and the terminal for outputting the RF output signal $RF_{out}$. The output matching unit 50 includes one or more output matching circuits 51. For example, the output matching circuit 51 may be a circuit in which an inductor and a capacitor are connected to each other, and may include a transformer.

The output matching unit 50 may be manufactured together with the power stage 40 as one IC by the semiconductor manufacturing process. In addition, in contrast to the power stage 40, the output matching unit 50 may not be implemented inside the IC, and may be directly mounted in the communication module independently from the IC. In this case, since the output matching unit 50 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

Referring to FIG. 4, it is possible to facilitate power loss minimization and circuit optimization while reducing a manufacturing cost by directly mounting the inter-stage matching unit 30 in the communication module independently from the drive stage 20 and the power stage 40. Furthermore, when either one or both of the input matching unit 10 and the output matching unit 50 are independently mounted in a communication module, a manufacturing cost is further reduced, and power loss minimization and circuit optimization may be more easily performed.

Alternatively, the power stage 40, which requires relatively high linear power, may be implemented in a substrate containing gallium arsenide to implement the drive stage 20, which requires relatively low power, on a substrate containing silicon having a low unit cost while efficiency of the power amplifier system 100-3 is increased, thereby reducing a cost of the power amplifier system 100-3.

Figure 5:
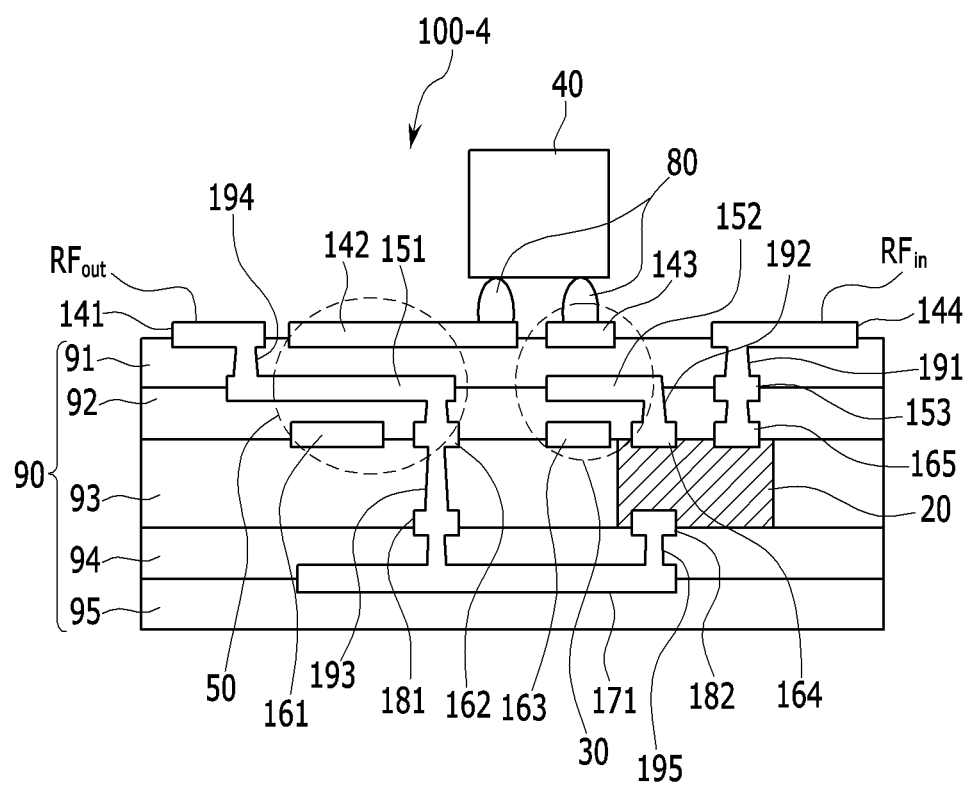
FIG. 5 illustrates a cross-section of a power amplifier system, according to an embodiment.

FIG. 5 illustrates a cross-section of a power amplifier system 100-4, according to an embodiment.

Referring to FIG. 5, the power amplifier system 100-4 may generate an RF output signal by amplifying an RF input signal at a predetermined ratio. The power amplifier system 100-4 is implemented in the base substrate 90 including a plurality of base layers 91, 92, 93, 94, and 95 to include the drive stage 20, the inter-stage matching unit 30, the power stage 40, and the output matching unit 50.

The drive stage 20 receives power and amplifies the RF input signal $RF_{in}$. The drive stage 20 includes one or more drive amplifiers. When the drive amplifier amplifies the RF input signal $RF_{in}$ based on a predetermined gain, a gain of the drive amplifier may be determined based on a breakdown voltage of the drive amplifier.

The RF input signal $RF_{in}$ is input into an RF input terminal pattern 144. The RF input terminal pattern 144 and a drive stage input pattern 165 are connected to each other through a first via 191. The first via 191 vertically penetrates the first base layer 91 and the second base layer 92 of the base substrate 90, and overlaps an alignment pattern 153 positioned on the second base layer 92. The RF input signal $RF_{in}$ is input into the drive stage 20 through the first via 191 and the drive stage input pattern 165 to be amplified. The RF signal amplified by the drive stage 20 is output through a drive stage output pattern 164.

The drive stage 20 may be implemented as a single IC by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20 is implemented in a silicon substrate, a cost of the power amplifier system 100-4 may be lowered. Furthermore, since the power amplifier system 100-4 occupies a largest proportion of a unit cost of a communication module, the unit cost of the communication module may be greatly reduced. However, the drive stage 20 may be implemented as a single IC by a semiconductor manufacturing process using a substrate containing gallium arsenic.

The input matching unit may be selectively implemented inside the drive stage 20, and in this case, the input matching unit and the drive stage 20 are implemented as a single IC.

In addition, the drive stage 20 is embedded inside the base substrate 90. For example, the drive stage 20 is disposed at or in the third base layer 93. Accordingly, a power loss of the drive stage 20 may be reduced by about 50% or more, and a gain of the drive stage 20 may be increased.

The inter-stage matching unit 30 may match impedance of the signal transfer path between the drive terminal 20 and the power stage 40. The inter-stage matching unit 30 may be a transformer. In addition, the inter-stage matching circuit 30 may be a circuit in which an inductor and a capacitor are connected to each other, and the inter-stage matching unit 30 may be, for example, an L-type circuit, a T-type circuit, a π-type circuit, or the like.

The inter-stage matching unit 30 includes, for example, a first inter-stage matching pattern 163, a second inter-stage matching pattern 152, and a third inter-stage matching pattern 143. The first inter-stage matching pattern 163 is positioned on the third base layer 93. The second inter-stage matching pattern 152 is positioned on the second base layer 92, and overlaps at least a portion of the first inter-stage matching pattern 163. The second inter-stage matching pattern 152 and the drive output pattern 164 are connected to each other through a second via 192 penetrating the second base layer 92, and, accordingly, the second inter-stage matching pattern 152 receives the RF signal amplified by the drive stage 20. The third inter-stage matching pattern 143 is positioned on the first base layer 91, overlaps at least a portion of the first inter-stage matching pattern 163, and overlaps at least a portion of the second inter-stage matching pattern 152. The RF signal outputted from the drive stage output pattern 164 is sequentially input into the power stage 40 through the inter-stage matching unit 30 and the electrical connection structure 80.

Since the inter-stage matching unit 30 is integrated inside the base substrate 90, unnecessary wires may not be included, and a space of the communication module may be efficiently utilized. In addition, since the inter-stage matching unit 30 is not implemented inside the IC, which is expensive, a total manufacturing cost may be reduced. In addition, in this case, since circuit elements having inductance values or capacitance values that are difficult to be used inside the IC may be integrated within the base substrate 90, loss of an RF signal may be minimized and circuit optimization may be facilitated.

The power stage 40 receives power and amplifies the RF signal from the drive stage 20 to output an RF output signal. The power stage 40 includes one or more power amplifiers (e.g., the one or more power amplifiers 41 in FIG. 3). The power stage 40 is installed outside the base substrate 90, and the power stage 40 is connected to the base substrate 90 through the electrical connection structure 80. For example, the electrical connection structure 80 may have a structure such as a solder ball, a pin, a land, or a pad.

The power stage 40 may be implemented as a single IC by a semiconductor manufacturing process using a substrate containing gallium arsenic. When the substrate containing gallium arsenic is used, as electron mobility of gallium arsenic is higher than that of silicon, and required wire capacity is small, an electrical characteristic is excellent. Accordingly, when the power stage 40 is implemented in the substrate containing gallium arsenic, linearity is high, and high power output is easily obtained due to a high breakdown voltage. An IC formed on a substrate containing gallium arsenide can achieve higher power and higher linearity than an IC formed on the substrate containing silicon, and, thus, the RF signal amplified through the power amplifier of the power stage 40 may have high power and linearity, and may have high reliability. However, the power stage 40 may be implemented as a single IC by a semiconductor manufacturing process using a substrate containing silicon.

The output matching unit 50 may match impedance for a signal transfer path between the power stage 40 and the terminal for outputting the RF output signal $RF_{out}$. The output matching unit 50 may be a transformer. In addition, the output matching unit 50 may be a circuit in which an inductor and a capacitor are connected to each other, and the output matching unit 50 may be, for example, an L-type circuit, a T-type circuit, a π-type circuit, or the like.

The output matching unit 50 includes a plurality of output matching patterns positioned in one or more layers. For example, the output matching unit 50 may include a first output matching pattern 142, a second output matching pattern 151, and a third output matching pattern 161. The first output matching pattern 142 is positioned on the first base layer 91, and receives the RF signal amplified by the power stage 40 through the electrical connection structure 80. The second output matching pattern 151 is positioned on the second base layer 92, and overlaps at least a portion of the first output matching pattern 142. The second output matching pattern 151 is connected to a ground pattern 171 through a third via 193, and accordingly, the output matching unit 50 is grounded. In addition, the ground pattern 171 is connected to a lower pattern 182 of the drive stage 20 through a fifth via 195, and accordingly, the drive stage 20 is grounded. The third via 193 vertically penetrates the second base layer 92, the third base layer 93, and the fourth base layer 94 of the base substrate 90, overlaps an alignment pattern 162 positioned on the third base layer 93, and overlaps an alignment pattern 181 positioned on the fourth base layer 94. The second output matching pattern 151 is connected to an RF output pattern 141 through a fourth via 194 vertically penetrating the first base layer 91 of the base substrate 90, and accordingly the RF signal amplified for the power stage 40 is transmitted to the RF output pattern 141 to be outputted to a terminal of the RF output signal. The third output matching pattern 161 is positioned on the third base layer 93, overlaps at least a portion of the first output matching pattern 142, and overlaps at least a portion of the second output matching pattern 151. The ground pattern 171 overlaps at least a portion of the first output matching pattern 142, overlaps at least a portion of the second output matching pattern 151, and overlaps at least a portion of the third output matching pattern 161.

Since the output matching unit 50 is integrated inside the base substrate 90, unnecessary wires may not be included, and a space of the communication module may be efficiently utilized. In addition, since the output matching unit 50 is not implemented inside the IC, which is expensive, a total manufacturing cost may be reduced. In addition, in this case, since circuit elements having inductance values or capacitance values that are difficult to be used inside the IC may be integrated within the base substrate 90, loss of an RF signal may be minimized and circuit optimization may be facilitated.

Referring to FIG. 5, heat generation of the power amplifier system 100-4 may be minimized by installing the power stage 40, which generates a lot of heat, outside the base substrate 90. Additionally, heat loss due to grounding may be minimized by embedding the drive stage 20, which generates relatively little heat, inside the base substrate 90, thereby minimizing power loss of the power amplifier system 100. In addition, a size of the communication module can be reduced by maximizing space utilization of the communication module by vertically arranging the power stage 40 and the drive stage 20.

Alternatively, the power stage 40, which requires relatively high linear power, may be implemented in a substrate containing gallium arsenide to implement the drive stage 20, which requires relatively low power, on a substrate containing silicon having a low unit cost while efficiency of the power amplifier system 100-4 is increased, thereby reducing a cost of the power amplifier system 100-4. Accordingly, the power loss of the power amplifier system 100-4 is minimized, and thus the power amplifier system 100-4 may have high linear power and high power efficiency, and simultaneously, the manufacturing cost of the power amplifier system 100-4 may be minimized.

Figure 6:
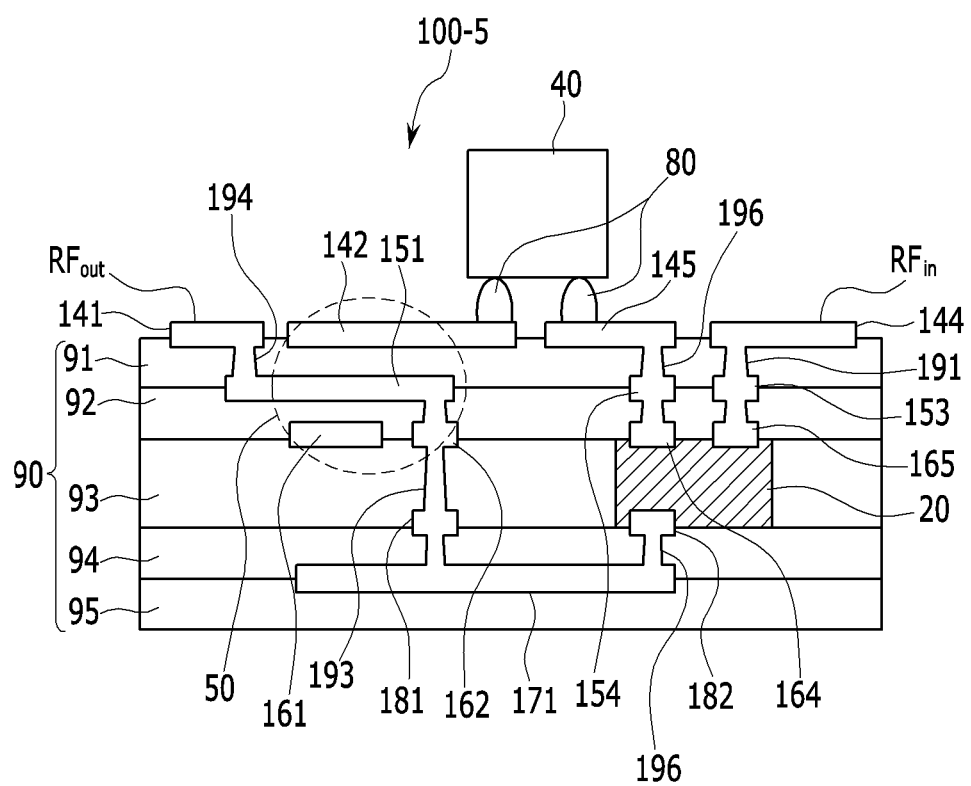
FIG. 6 illustrates a cross-section of a power amplifier system, according to an embodiment.

FIG. 6 illustrates a cross-section of a power amplifier system 100-5, according to an embodiment.

Referring to FIG. 6, the power amplifier system 100-5 may generate an RF output signal by amplifying an RF input signal at a predetermined ratio. The power amplifier system 100-5 is implemented in the base substrate 90 including the plurality of base layers 91, 92, 93, 94, and 95 to include the drive stage 20, the power stage 40, and the output matching unit 50.

The drive stage 20 receives power and amplifies the RF input signal $RF_{in}$. The drive stage 20 includes one or more drive amplifiers (e.g., the one or more drive amplifiers 21 in FIG. 3). When the drive amplifier amplifies the RF input signal $RF_{in}$ based on a predetermined gain, a gain of the drive amplifier may be determined based on a breakdown voltage of the drive amplifier.

The RF input signal $RF_{in}$ is input into the RF input terminal pattern 144. The RF input terminal pattern 144 and the drive stage input pattern 165 are connected to each other through a first via 191. The first via 191 vertically penetrates the first base layer 91 and the second base layer 92 of the base substrate 90, and overlaps an alignment pattern 153 positioned on the second base layer 92. The RF input signal $RF_{in}$ is inputted into the drive stage 20 through the first via 191 and the drive stage input pattern 165 to be amplified. The RF signal amplified by the drive stage 20 is output through a drive stage output pattern 164.

The drive stage 20 may be implemented as a single IC by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20 is implemented in a silicon substrate, a cost of the power amplifier system 100-5 may be lowered. Furthermore, since the power amplifier system 100-5 occupies a largest proportion of a unit cost of a communication module, the unit cost of the communication module may be greatly reduced. However, the drive stage 20 may be implemented as a single IC by a semiconductor manufacturing process using a substrate containing gallium arsenic.

Either one or both of the input matching unit and the inter-stage matching unit may be selectively implemented inside the drive stage 20, and, in this case, either one or both of the input matching unit and the inter-stage matching unit are implemented as a single IC together with the drive stage 20.

In addition, the drive stage 20 is embedded inside the base substrate 90. For example, the drive stage 20 is disposed at the third base layer 93. Accordingly, a power loss of the drive stage 20 may be reduced by about 50% or more, and a gain of the drive stage 20 may be increased.

The power stage 40 receives power and amplifies the RF signal from the drive stage 20 to output an RF output signal. The power stage 40 includes one or more power amplifiers (e.g., the one or more power amplifiers 41 in FIG. 3). The power stage 40 is installed outside the base substrate 90, and the power stage 40 is connected to the base substrate 90 through an electrical connection structure 80. For example, the electrical connection structure 80 may have a structure such as a solder ball, a pin, a land, or a pad.

The RF signal amplified by the drive stage 20 is output through the drive stage output pattern 164, and the drive stage output pattern 164 and the power stage input pattern 145 are connected to each other through a fifth via 196. The fifth via 196 vertically penetrates the first base layer 91 and the second base layer 92 of the base substrate 90, and overlaps an alignment pattern 154 positioned on the second base layer 92.

The power stage 40 may be implemented as a single IC by a semiconductor manufacturing process using a substrate containing gallium arsenic. When the substrate containing gallium arsenic is used, as electron mobility of gallium arsenic is higher than that of silicon, and required wire capacity is small, an electrical characteristic is excellent.

Accordingly, when the power stage 40 is implemented in the substrate containing gallium arsenic, linearity is high, and high power output is easily obtained due to a high breakdown voltage. An IC formed on a substrate containing gallium arsenide can achieve higher power and higher linearity than an IC formed on the substrate containing silicon, and thus the RF signal amplified through the power amplifier of the power stage 40 may have high power and linearity, and may have high reliability. However, the power stage 40 may be implemented as a single IC by a semiconductor manufacturing process using a substrate containing silicon.

In addition, the inter-stage matching unit may be selectively implemented inside the power stage 40, and in this case, the inter-stage matching unit together with the power stage 40 are implemented as a single IC.

The output matching unit 50 may match impedance for a signal transfer path between the power stage 40 and a terminal for outputting the RF output signal $RF_{out}$. The output matching unit 50 may be a transformer. In addition, the output matching circuit 50 may be a circuit in which an inductor and a capacitor are connected to each other, and the output matching unit 50 may be, for example, an L-type circuit, a T-type circuit, a π-type circuit, or the like.

The output matching unit 50 includes a plurality of output matching patterns positioned in one or more layers. For example, the output matching unit 50 may include the first output matching pattern 142, the second output matching pattern 151, and the third output matching pattern 161. The first output matching pattern 142 is positioned on the first base layer 91, and receives the RF signal amplified by the power stage 40 through the electrical connection structure 80. The second output matching pattern 151 is positioned on the second base layer 92, and overlaps at least a portion of the first output matching pattern 142. The second output matching pattern 151 is connected to the ground pattern 171 through the third via 193, and accordingly, the output matching unit 50 is grounded. In addition, the ground pattern 171 is connected to the lower pattern 182 of the drive stage 20 through the fifth via 196, and accordingly, the drive stage 20 is grounded. The third via 193 vertically penetrates the second base layer 92, the third base layer 93, and the fourth base layer 94 of the base substrate 90, overlaps the alignment pattern 162 positioned on the third base layer 93, and overlaps the alignment pattern 181 positioned on the fourth base layer 94. The second output matching pattern 151 is connected to the RF output pattern 141 through a fourth via 194 vertically penetrating the first base layer 91 of the base substrate 90, and accordingly the RF signal amplified for the power stage 40 is transmitted to the RF output pattern 141 to be output to the terminal of the RF output signal. The third output matching pattern 161 is positioned on the third base layer 93, overlaps at least a portion of the first output matching pattern 142, and overlaps at least a portion of the second output matching pattern 151. The ground pattern 171 overlaps at least a portion of the first output matching pattern 142, overlaps at least a portion of the second output matching pattern 151, and overlaps at least a portion of the third output matching pattern 161. In addition, the output matching unit 50 may be a circuit in which an inductor and a capacitor are connected.

Since the output matching unit 50 is integrated inside the base substrate 90, unnecessary wires may not be included, and a space of a communication module may be efficiently utilized. In addition, since the output matching unit 50 is not implemented inside the IC, which is expensive, a total manufacturing cost may be reduced. In addition, in this case, since circuit elements having inductance values or capacitance values that are difficult to be used inside the IC may be integrated within the base substrate 90, loss of an RF signal may be minimized and circuit optimization may be facilitated.

Referring to FIG. 6, heat generation of the power amplifier system 100-5 may be minimized by installing the power stage 40, which generates a lot of heat, outside the base substrate 90. Furthermore, heat loss due to grounding may be minimized by embedding the drive stage 20, which generates relatively little heat, inside the base substrate 90, thereby minimizing power loss of the power amplifier system 100. In addition, a size of the communication module can be reduced by maximizing space utilization of the communication module by vertically arranging the power stage 40 and the drive stage 20.

Alternatively, the power stage 40, which requires relatively high linear power, may be implemented in a substrate containing gallium arsenide to implement the drive stage 20, which requires relatively low power, on a substrate containing silicon having a low unit cost while efficiency of the power amplifier system 100-5 is increased, thereby reducing a cost of the power amplifier system 100-5. Accordingly, the power loss of the power amplifier system 100-5 is minimized, and thus the power amplifier system 100-5 may have high linear power and high power efficiency, and simultaneously, the manufacturing cost of the power amplifier system 100-5 may be minimized.

Figure 7:
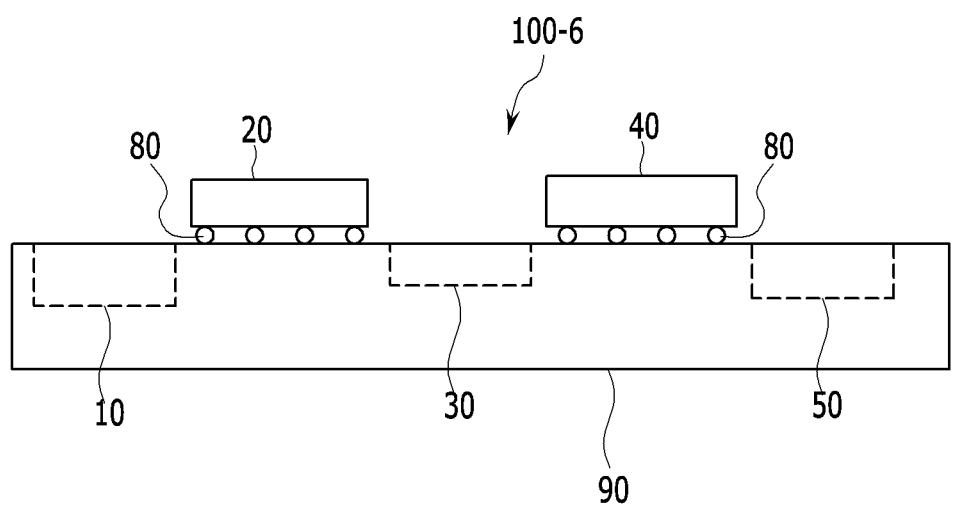
FIG. 7 illustrates a cross-section of a power amplifier system, according to an embodiment.

FIG. 7 illustrates a cross-section of a power amplifier system 100-6, according to an embodiment.

Referring to FIG. 7, the power amplifier system 100 includes the input matching unit 10, the drive stage 20, the inter-stage matching unit 30, the power stage 40, and the output matching unit 50. The drive stage 20 and the power stage 40 are connected to each other through the electrical connection structure 80 on the base substrate 90. For example, the electrical connection structure 80 may have a structure such as a solder ball, a pin, a land, or a pad. The drive stage 20 may be implemented as a single IC by a semiconductor manufacturing process, and the power stage 40 may be implemented as a single IC by a manufacturing process.

Each of the input matching unit 10, the inter-stage matching unit 30, and the output matching unit 50 may be integrated inside the base substrate 90. In addition, any one or any combination of any two or more of the input matching unit 10, the inter-stage matching unit 30, and the output matching unit 50 may be installed outside the base substrate 90 independently from the drive stage 20 and the power stage 40. Either one or both of the input matching unit 10 and the inter-stage matching unit 30 may be manufactured as a single IC together with the drive stage 20 to be connected to the base substrate 90 through the electrical connection structure 80. Either one or both of the inter-stage matching unit 30 and the output matching unit 50 may be manufactured as a single IC together with the power stage 40 to be connected to the base substrate through the electrical connection structure 80.

Referring to FIG. 7, it is possible to facilitate power loss minimization and circuit optimization while reducing a manufacturing cost by directly mounting the inter-stage matching unit 30 in the communication module independently from the drive stage 20 and the power stage 40. Alternatively, the power stage 40, which requires relatively high linear power, may be implemented in a substrate containing gallium arsenide to implement the drive stage 20, which requires relatively low power, on a substrate containing silicon having a low unit cost while efficiency of the power amplifier system 100-6 is increased, thereby reducing a cost of the power amplifier system 100-6.

Figure 8:
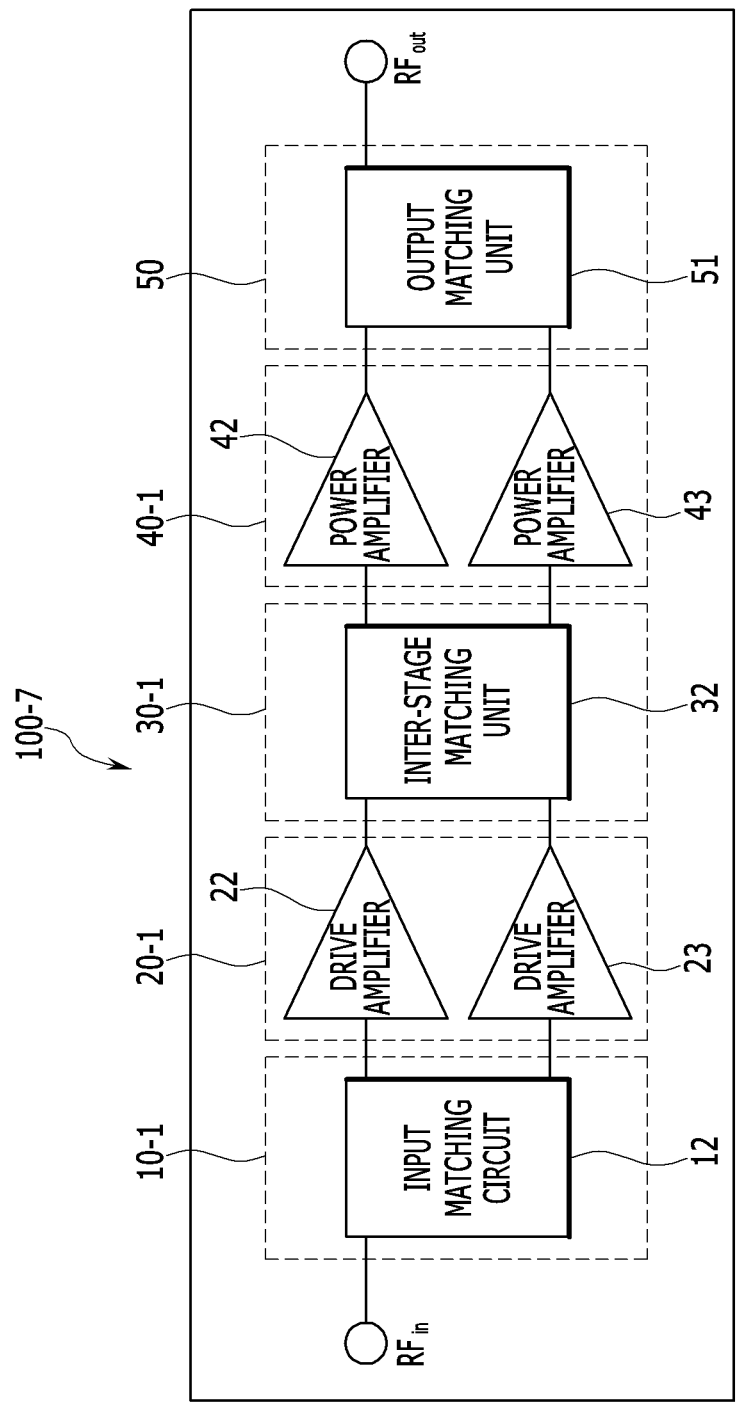
FIG. 8 illustrates a power amplifier system, according to an embodiment.

FIG. 8 illustrates a power amplifier system 100-7, according to an embodiment.

Referring to FIG. 8, the power amplifier system 100-7 may receive an RF input signal $RF_{in}$ and amplify the RF input signal $RF_{in}$ at a predetermined ratio to generate an RF output signal $RF_{out}$. The power amplifier system 100-7 includes an input matching unit 10-1, a drive stage 20-1, an inter-stage matching unit 30-1, a power stage 40-1, and the output matching unit 50.

The input matching unit 10-1 may match impedance of the signal transfer path between the drive stage 20-1 and the terminal receiving the RF input signal $RF_{in}$. The input matching unit 10-1 includes one or more input matching circuits 12. For example, the input matching circuit 12 may be a circuit in which an inductor and a capacitor are connected to each other, and may include a transformer. The input matching circuit 12 receives the RF input signal $RF_{in}$ and then outputs the inverted RF input signal $RF_{in}$ and the non-inverted RF input signal $RF_{in}$. The input matching circuit 12 is connected to a pair of drive amplifiers 22 and 23.

The drive stage 20-1 includes the pair of drive amplifiers 22 and 23 for performing differential amplification. The drive amplifiers 22 and 23 receive power to amplify a difference between signals input thereto. The drive amplifiers 22 and 23 have a differential mode that greatly amplifies and outputs signals of opposite phases, and a common mode that cancels and outputs signals of a same phase. For example, the drive amplifiers 22 and 23, when configured to perform the differential amplification, receive an inverted RF input signal $RF_{in}$ and a non-inverted RF input signal $RF_{in}$, respectively, and thus a signal having an amplitude of approximately twice a sum of amplitudes of the inverted RF input signal $RF_{in}$ and the non-inverted RF input signal $RF_{in}$ may be output in a differential mode. However, since voltages applied to the pair of drive amplifiers 22 and 23 or currents flowing in the pair of drive amplifiers 22 and 23 have a same phase, noise included in the voltages or currents may be canceled out of the output of the drive amplifiers 22 and 23. Accordingly, the power amplifier system 100-7 may have high linear power and high efficiency.

The drive stage 20-1 may be implemented as a single IC by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20-1 is implemented in a silicon substrate, a cost of the power amplifier system 100-7 may be lowered. Furthermore, since the power amplifier system 100-7 occupies a largest proportion of a unit cost of a communication module, the unit cost of the communication module may be greatly reduced. However, the drive stage 20-1 may be implemented as a single IC by a semiconductor manufacturing process using a substrate containing gallium arsenic.

The input matching unit 10-1 and the drive stage 20 may be manufactured together as one IC by the semiconductor manufacturing process. In addition, in contrast to the drive stage 20, the input matching unit 10-1 is not implemented inside the IC, and may be directly mounted in the communication module independent from the IC. In this case, since the input matching unit 10-1 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

The drive stage 20-1 may be installed outside the base substrate, and, in this case, the drive stage 20-1 may be connected to the base substrate through an electrical connection structure. In addition, the drive stage 20-1 may be embedded within the base substrate. In this case, since there is no power loss caused by the electrical connection structure, the power loss of the drive stage 20-1 may be greatly reduced, and a gain of the drive stage 20-1 may be increased.

The inter-stage matching unit 30-1 may match impedance of the signal transfer path between the drive stage 20-1 and the power stage 40-1. The inter-stage matching unit 30-1 includes one or more inter-stage matching circuits 32. For example, the inter-stage matching circuit 32 may be a circuit in which an inductor and a capacitor are connected to each other, and may include a transformer. The inter-stage matching circuit 32 is connected to a pair of power amplifiers 42 and 43.

The power stage 40-1 amplifies an RF signal from the drive stage 20-1 by receiving power. The power stage 40-1 includes the pair of power amplifiers 42 and 43. The power amplifiers 42 and 43 respectively amplify the RF signals amplified by the drive amplifiers 22 and 23. Each of the power amplifiers 42 and 43 is connected to the terminal of the RF output signal $RF_{out}$. Accordingly, the signals amplified by the power amplifiers 42 and 43 are synthesized by the output matching unit 50 to output an RF signal, thereby generally increasing amplification efficiency of the power stage 40-1.

The power stage 40-1 may be installed outside the base substrate, and in this case, the power stage 40-1 may be connected to the base substrate through an electrical connection structure. For example, the electrical connection structure may have a structure such as a solder ball, a pin, a land, or a pad.

The power stage 40-1 may be implemented as a single IC by a semiconductor manufacturing process using a substrate containing gallium arsenic. When the substrate containing gallium arsenic is used, since electron mobility of gallium arsenic is higher than that of silicon, and required wire capacity is small, an electrical characteristic is excellent. Accordingly, when the power stage 40-1 is implemented in the substrate containing gallium arsenic, linearity is high, and high power output is easily obtained due to a high breakdown voltage. An IC formed on a substrate containing gallium arsenide can achieve higher power and higher linearity than an IC formed on the substrate containing silicon, and thus the RF signal amplified through the power amplifiers 42 and 43 of the power stage 40-1 may have high power and linearity, and may have high reliability. However, the power stage 40-1 may be implemented as a single IC by a semiconductor manufacturing process using a substrate containing silicon.

The inter-stage matching unit 30-1 may also not be included anywhere inside the IC in which the drive stage 20-1 is implemented or the IC in which the power stage 40-1 is implemented, and may be directly mounted in the communication module independently from these ICs. In this case, since the inter-stage matching unit 30-1 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated. In addition, the inter-stage matching unit 30-1 may be manufactured as a single IC together with the power stage 40-1 by a semiconductor manufacturing process.

The output matching unit 50 may match impedance of the signal transfer path between the power stage 40-1 and the terminal for outputting the RF output signal $RF_{out}$, and may synthesize the signals outputted from the power amplifiers 42 and 43, and then output the a synthesized RF signal to the terminal of the RF output signal $RF_{out}$. The output matching unit 50 includes the one or more output matching circuits 51. For example, the output matching circuit 51 may be a circuit in which an inductor and a capacitor are connected to each other, and may include a transformer.

The output matching unit 50 and the power stage 40-1 may be manufactured together as one IC by the semiconductor manufacturing process. In addition, in contrast to the power stage 40-1, the output matching unit 50 may not be implemented inside the IC, and may be directly mounted in the communication module independently from the IC. In this case, since the output matching unit 50 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

Referring to FIG. 8, it is possible to facilitate power loss minimization and circuit optimization while reducing a manufacturing cost by directly mounting the inter-stage matching unit 30-1 in the communication module independently from the drive stage 20-1 and the power stage 40-1. Furthermore, when either one or both of the input matching unit 10 and the output matching unit 50 are independently mounted in a communication module, a manufacturing cost is further reduced, and power loss minimization and circuit optimization may be more easily performed.

Alternatively, the power stage 40, which requires relatively high linear power, may be implemented in a substrate containing gallium arsenide to implement the drive stage 20-1, which requires relatively low power, on a substrate containing silicon having a low unit cost while efficiency of the power amplifier system 100-7 is increased, thereby reducing a cost of the power amplifier system 100-7.

Figure 9:
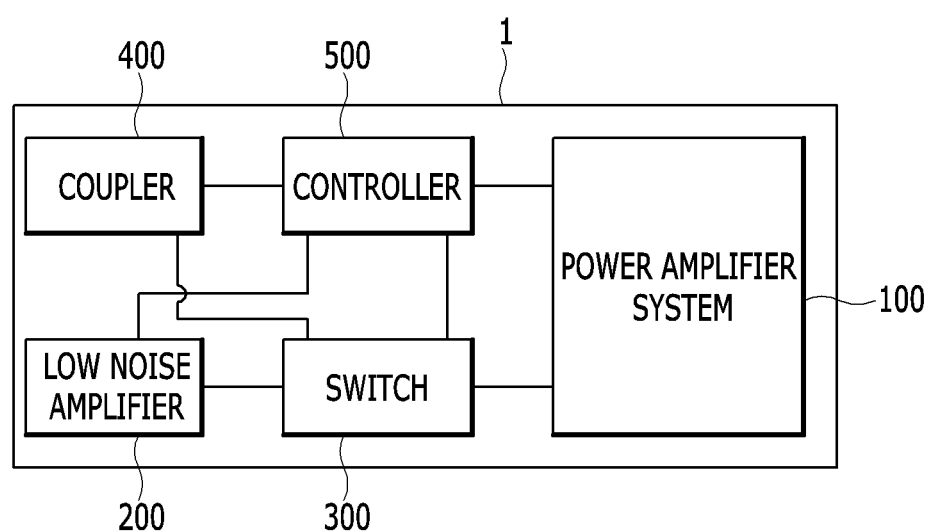
FIG. 9 illustrates a top plan view of a communication system, according to an embodiment.

FIG. 9 illustrates a top plan view of a communication system 1, according to an embodiment.

Referring to FIG. 9, the communication system 1 includes the power amplifier system 100, a low noise amplifier 200, a switch 300, a coupler 400, and a controller 500. Although the power amplifier system 100 is described in FIG. 9 for convenience, it is to be understood that the power amplifier systems 100-1 to 100-7 described with reference to FIGS. 2 to FIG. 8 may be applied to the communication system 1 in place of the power amplifier system 100.

Among the components constituting the communication system 1, the power amplifier system 100 occupies a largest area in the communication system 1. Accordingly, as described above, since the power amplifier system 100 has a small area, an entire size of the communication system 1 may be reduced.

The power amplifier system 100 amplifies an RF signal transmitted through an antenna. Accordingly, linear power and efficiency of the power amplifier system 100 may be increased, and reliability of the power amplifier system 100 may be increased, so that the communication system 1 may sufficiently satisfy the 5G NR standard.

The low noise amplifier 200 amplifies an RF signal received through an antenna. The low noise amplifier 200 may amplify a very small level of an RF signal while distinguishing the RF signal from noise. The low noise amplifier 200 may be disposed near the antenna. A band stop filter may be connected between the low noise amplifier 200 and the switch 300. The band stop filter may allow only a signal of a specific frequency band to not pass therethrough.

The switch 300 may change a path for an RF signal passing through the power amplifier system 100 and the low noise amplifier 200. For example, the switch 300 may be configured to allow either the power amplifier system 100 or the low noise amplifier 200 to receive the RF signal. In addition, the switch 300 may connect the power amplifier system 100 with the controller 500 of the communication system 1, or connect the power amplifier system 100 with a communication system having a different communication standard from that of the communication system 1. The switch 300 may also connect the low noise amplifier 200 with the controller 500 of the communication system 1, or connect the low noise amplifier 200 with a communication system having a different communication standard from that of the communication system 1.

The coupler 400 may perform power sampling or power dividing on an input RF signal. The coupler 400 is connected to the switch 300. For example, the coupler 400 may detect power of the RF signal passing through the power amplifier system 100 and the low noise amplifier 200, and the detected power may be used to control the power amplifier system 100 and the low noise amplifier 200 by using the controller 500. In addition, the coupler 400 may divide and transmit an RF signal, and the divided RF signals may be used in a plurality of communication systems, respectively. A bandpass filter may be connected between the coupler 400 and the switch 300. The bandpass filter may transfer only a signal of a specific frequency band to a next stage, and may remove noise.

The controller 500 may be connected to the power amplifier system 100, the low noise amplifier 200, the switch 300, and the coupler 400 to control the power amplifier system 100, the low noise amplifier 200, the switch 300, and the coupler 400. The controller 500 may include a memory, a processor, or the like to perform digital signal processing.

The communication system 1 may be implemented in electronic devices. For example, the electronic device may be a smart phone, a personal digital assistant, a digital video camera, a digital still camera, a network system, a computer, a monitor, a tablet, a laptop, a network, a television, a video game, a smart watch, an automotive device, or the like.

The input matching units 10 and 10-1, the drive stages 20 and 20-1, the inter-stage matching units 30 and 30-1, the power stages 40 and 40-1, the output matching unit 50, the coupler 400, and the controller 500 in FIGS. 1-9 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier system, comprising:
   a base substrate;
   a driver stage configured to receive and amplify an RF input signal, wherein the driver stage is disposed within the base substrate and is implemented in a first substrate; and
   a power stage configured to receive the RF input signal amplified by the driver stage and amplify the RF input signal amplified by the driver stage, wherein the power stage is disposed outside the base substrate and is implemented in a second substrate independent from the first substrate.

2. The power amplifier system of claim 1, further comprising:
   an inter-stage matcher disposed in the base substrate, and configured to match impedance of a signal transfer path between the driver stage and the power stage.

3. The power amplifier system of claim 2, wherein the inter-stage matcher includes a plurality of inter-stage matching patterns positioned in one or more layers.

4. The power amplifier system of claim 2, wherein the inter-stage matcher includes a transformer, or a circuit including an inductor and a capacitor connected to each other.

5. The power amplifier system of claim 1, further comprising an inter-stage matcher implemented in the driver stage, and configured to match impedance of a signal transfer path between the driver stage and the power stage.

6. The power amplifier system of claim 1, further comprising an inter-stage matcher implemented in the power stage, and configured to match impedance of a signal transfer path between the driver stage and the power stage.

7. The power amplifier system of claim 1, further comprising an output matcher mounted in the base substrate, and configured to match impedance of a signal transfer path between the power stage and a terminal of an RF output signal output from the output matcher.

8. The power amplifier system of claim 7, wherein the output matcher includes a plurality of output matching patterns positioned in one or more layers.

9. The power amplifier system of claim 7, wherein the output matcher includes a transformer, or a circuit including an inductor and a capacitor connected to each other.

10. The power amplifier system of claim 1, further comprising:
    an output matcher implemented in the power stage, and configured to match impedance of a signal transfer path between the power stage and a terminal of an RF output signal output from the output matcher.

11. The power amplifier system of claim 1, wherein the drive stage includes:
    a first drive amplifier configured to receive and amplify a non-inverted RF input signal of the RF input signal; and
    a second drive amplifier configured to receive and amplify an inverted RF input signal of the RF input signal.

12. The power amplifier system of claim 11, wherein the power stage includes:
    a first power amplifier configured to amplify the non-inverted RF input signal amplified by the first drive amplifier; and
    a second power amplifier configured to amplify the inverted RF input signal amplified by the first drive amplifier.

13. A power amplifier system, comprising:
    a drive stage configured to receive and amplify an RF input signal, and implemented in a first substrate;
    a power stage configured to receive an RF signal from the driver stage and amplify the RF signal, wherein the power stage is connected to the drive stage and is implemented in a second substrate independent from the first substrate; and an inter-stage matcher configured to match impedance of a signal transfer path between the driver stage and the power stage, wherein the inter-stage matcher is implemented in a third substrate independent from the drive stage and the power stage or the inter-stage matcher is implemented in the second substrate together with the power stage.

14. The power amplifier system of claim 13, further comprising:
an output matcher configured to match impedance of a signal transfer path between the power stage and a terminal of an RF output signal output from the output matcher.

15. The power amplifier system of claim 13, further comprising:
an input matcher configured to match impedance of a signal transfer path between the drive stage and a terminal of the RF input signal.

16. The power amplifier system of claim 13, wherein the RF input signal includes an inverted RF input signal and a non-inverted RF input signal, and the drive stage is further configured to amplify a difference between the inverted RF input signal and the non-inverted RF input signal.

17. The power amplifier system of claim 13, wherein the first substrate is formed of a first material, and the second substrate is formed of a second material having an electron mobility higher than an electron mobility of the first material.

18. The power amplifier system of claim 13, wherein the first substrate is formed of silicon and the second substrate is formed of gallium arsenide.

19. The power amplifier system of claim 13, wherein the inter-stage matcher is implemented in the third substrate, and the first substrate is embedded in the third substrate.

20. The power amplifier system of claim 19, wherein the second substrate is mounted on a surface of the third substrate, and the inter-stage matcher is disposed in the third substrate between the first substrate and the surface.

21. A power amplifier system, comprising:
a base substrate;
a first integrated circuit (IC) disposed in the base substrate and including one or more driver amplifiers implemented in a first substrate, wherein the one or more driver amplifiers are configured to receive and amplify an RF input signal; and
a second IC mounted on an outer surface of the base substrate and including one or more power amplifiers implemented in a second substrate having an electron mobility higher than an electron mobility of the first substrate, wherein the one or more power amplifiers are configured to receive the RF input signal amplified by the one or more driver amplifiers and amplify the RF input signal amplified by the one or more driver amplifiers.

22. The power amplifier system of claim 21, wherein the first substrate contains silicon and the second substrate contains gallium arsenide.

23. The power amplifier system of claim 21, further comprising:
an inter-stage matcher disposed in the first IC or the base substrate, and configured to match impedance of a signal transfer path between the one or more driver amplifiers and the one or more power amplifiers.

24. The power amplifier system of claim 21, further comprising:
an output matcher mounted in the second IC or the base substrate, and configured to match impedance of a signal transfer path between the one or more power amplifiers and a terminal of an RF output signal output from the output matcher.

25. A power amplifier system, comprising:
a base substrate;
a driver stage configured to receive and amplify an RF input signal, wherein the driver stage is externally mounted on the base substrate or embedded in the base substrate, and is implemented in a first substrate; and
a power stage configured to receive the RF input signal amplified by the driver stage and amplify the RF input signal amplified by the driver stage, wherein the power stage is externally mounted on the base substrate and is implemented in a second substrate independent from the first substrate.

26. The power amplifier system of claim 25, wherein the first substrate is formed of a first material, and the second substrate is formed of a second material having an electron mobility higher than an electron mobility of the first material.

27. The power amplifier system of claim 25, further comprising:
an inter-stage matcher implemented in any one of the driver stage, the power stage, and the base substrate, and configured to match impedance of a signal transfer path between the driver stage and the power stage.

28. The power amplifier system of claim 25, further comprising:
an output matcher implemented in the power stage or the base substrate, and configured to match impedance of a signal transfer path between the power stage and a terminal of an RF output signal output from the output matcher.

* * * * *